(12) United States Patent
Srikanth et al.

(10) Patent No.: US 7,002,378 B2
(45) Date of Patent: Feb. 21, 2006

(54) VALID DATA STROBE DETECTION TECHNIQUE

(75) Inventors: Adhiveeraraghavan Srikanth, Folsom, CA (US); Subrata Mandal, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 795 days.

(21) Appl. No.: 09/750,113

(22) Filed: Dec. 29, 2000

(65) Prior Publication Data

US 2002/0087768 A1 Jul. 4, 2002

(51) Int. Cl.
*H03D 1/00* (2006.01)

(52) U.S. Cl. .................................................. 327/50
(58) Field of Classification Search .................. 711/105; 365/193, 194, 233, 185.33, 189.01, 189.09, 365/207, 208; 327/50, 62, 28
See application file for complete search history.

(56) References Cited

U.S. PATENT DOCUMENTS

| | | | | |
|---|---|---|---|---|
| 4,306,194 A | * | 12/1981 | Chapman | 327/62 |
| 6,282,132 B1 | * | 8/2001 | Brown et al. | 365/193 |
| 6,456,544 B1 | * | 9/2002 | Zumkehr | 365/193 |
| 6,512,704 B1 | * | 1/2003 | Wu et al. | 365/193 |
| 6,529,993 B1 | * | 3/2003 | Rogers et al. | 711/105 |
| 6,570,791 B1 | * | 5/2003 | Roobparvar et al. | 365/185.33 |

* cited by examiner

*Primary Examiner*—Khanh Dang
(74) *Attorney, Agent, or Firm*—Blakely, Sokoloff, Taylor & Zafman LLP

(57) ABSTRACT

A valid data strobe detection technique detects a valid data strobe contained within a strobe signal by first determining whether a measured voltage level of the strobe signal is above or below a preselected threshold level. A time period in which the measured voltage level is continuously one of either above or below the preselected threshold level is then measured and a valid data strobe is detected upon the measured time period being greater than a preselected period of time. A comparator may be used to determine whether the measured voltage level of the strobe signal is above or below the preselected threshold level and a sample and hold unit may be used to measure the time period in which the strobe signal is one of either above or below the preselected threshold level.

9 Claims, 4 Drawing Sheets

VALID DATA STROBE DETECTION TECHNIQUE

FIELD

The present invention relates to a valid data strobe detection technique and more particularly to a technique for continuously monitoring a data strobe signal from a Double-Data-Rate Synchronous Dynamic Random Access Memory (DDR SDRAM), for example, and for validating the data strobe signal for subsequent use.

BACKGROUND

Ever-increasing speed requirements for memory access has resulted in the use of DDR architectures to achieve high-speed operation. The DDR architecture is used to transfer two data words per clock cycle between a memory controller and a DDR SDRAM. Source synchronous strobe signals are transmitted along with the data to enable capturing the data at the receiver. Series Stub Terminated Logic (SSTL_2) may be used for signaling as a JEDEC (Joint Electron Device Engineering Council) approved standard for DDR SDRAM—MCH (Memory Controller Hub) transactions. When there is no data transfer, the line is pulled to a high impedance state by the termination in accordance with this standard.

Transactions between the MCH and the DDR SDRAM are classified as READ transactions, WRITE transactions and other transactions. All transactions are referred to the memory controller. A READ cycle usually refers to the MCH reading data from the DDR SDRAM while a WRITE cycle usually refers to the MCH sending data to the DDR SDRAM.

When the MCH writes data into the DDR, it positions a data strobe signal (DQS) at the center of a valid data window. However, when the DDR SDRAM sends out data to the MCH, it edge aligns the data (DQ) and the DQS signals. When the DDR SDRAM receives an active READ command from the memory controller, it places the data and strobe edge aligned at the DDR. Prior to this, it pulls down the DQS signal line to a LOW logic level, typically for one clock period. This portion of the DQS signal is called the READ PREAMBLE. The READ PREAMBLE may vary plus or minus 10 percent, for example, from the clock period. Following the READ PREAMBLE, the rising and falling edges of the DQS signal are used for strobing in the data at the receiver.

However, a major shortcoming is that when the DDR SDRAM sends a READ PREAMBLE on the DQS signal line, the DQS line is transitioned to a LOW logic state from a high impedance state. During the time when the DQS line is in its high impedance state and during its transition to the LOW logic state, noise can cause the receiver to misinterpret noise pulses as a valid strobe, thereby causing the receiver to latch incorrect data. Accordingly, there is a need for a technique which can identify a valid READ PREAMBLE and subsequently use the validated PREAMBLE to latch the correct data at the receiver.

Furthermore, the existing DDR SDRAM protocol does not provide a feedback to the memory controller indicating when to look for the data strobe. Rather, the memory controller launches a READ command and then somehow identifies the arrival of the DQS strobe signal. This is usually accomplished by having additional pins at the memory controller for launching a reference signal which will track the DQS strobe signal. The launching of an active READ command, the CAS latency period, the flight time variation of the reference signal, the DQ-DQS skew information at the DDR SDRAM, etc., may be used to calculate a valid DQS window in which the DQS buffer is enabled. Such a technique is very much dependent on flight time uncertainties and imposes critical board routing constraints as well as requiring two additional pins which increases costs. Accordingly, there is also a need for a technique which uses built-in elements which form part of every DQS buffer and which is not dependent on arrival uncertainties of the DQS signal and does not impose severe board routing constraints.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same as by way of illustration and example only and the invention is not limited thereto. The spirit and scope of the present invention are limited only by the terms of the appended claims.

The following represents brief descriptions of the drawings, wherein.

DETAILED DESCRIPTION

Figure 1:
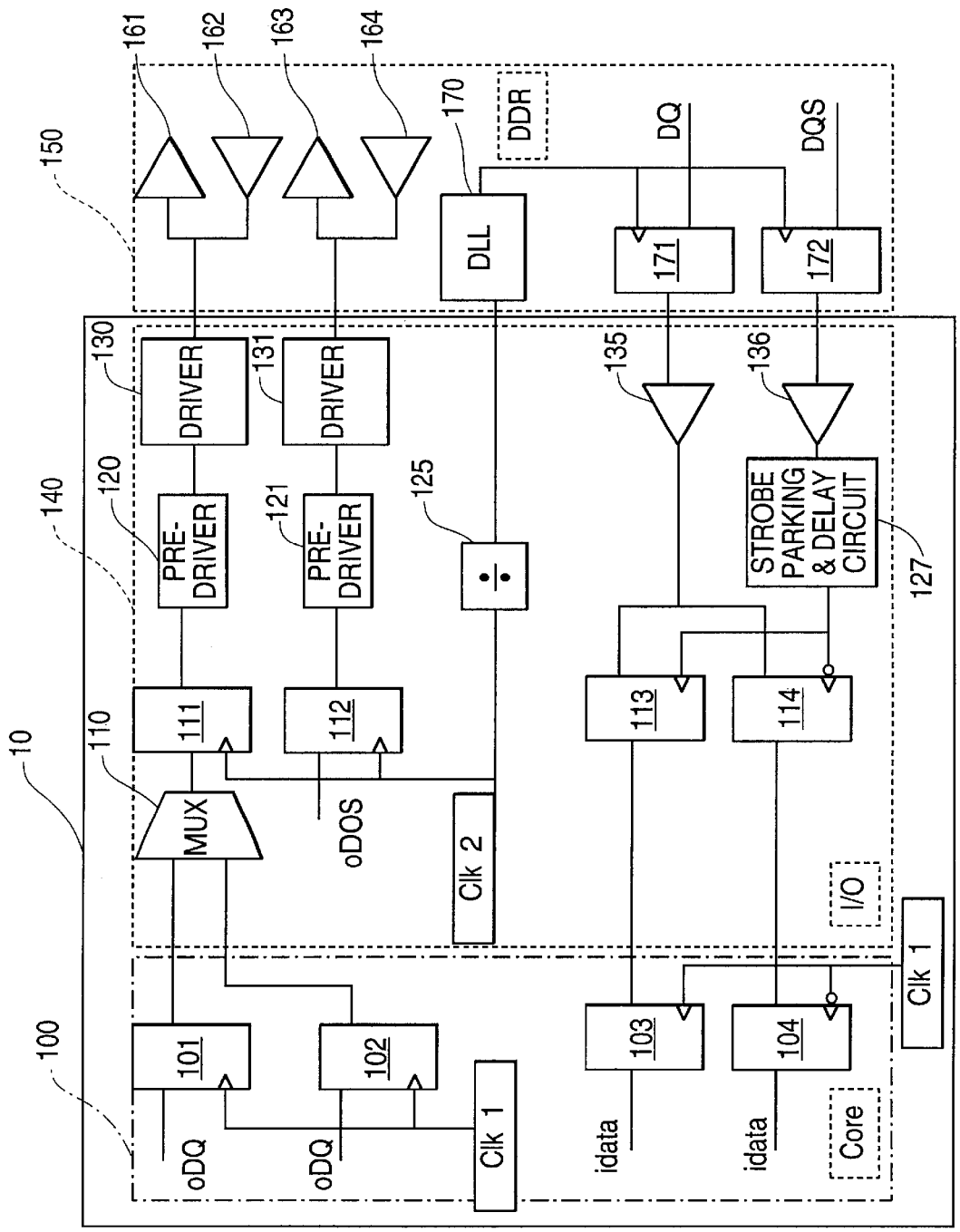
FIG. 1 is a block diagram of an example of a memory controller and associated elements.

Before beginning a detailed description of the subject invention, mention of the following is in order. When appropriate, like reference numerals and characters may be used to designate identical, corresponding, or similar components in differing drawing figures. Furthermore, in the detailed description to follow, example sizes/model/values/ranges may be given, although the present invention is not limited thereto. Still furthermore, clock signals and timing signals are not drawn to scale and instead, exemplary and critical time values are mentioned when appropriate. With regard to description of any timing signals, the terms assertion and negation may be used in an intended generic sense. Lastly, power connections and other well-known components have been omitted from the drawing figures for simplicity of illustration and discussion and so as not to obscure the present invention.

Although example embodiments of the present invention will be described with respect to the DQS signal for a DDR SDRAM, it is to be understood that the present invention is not limited thereto but rather may be utilized to validate any data strobe signal.

Figure 2:
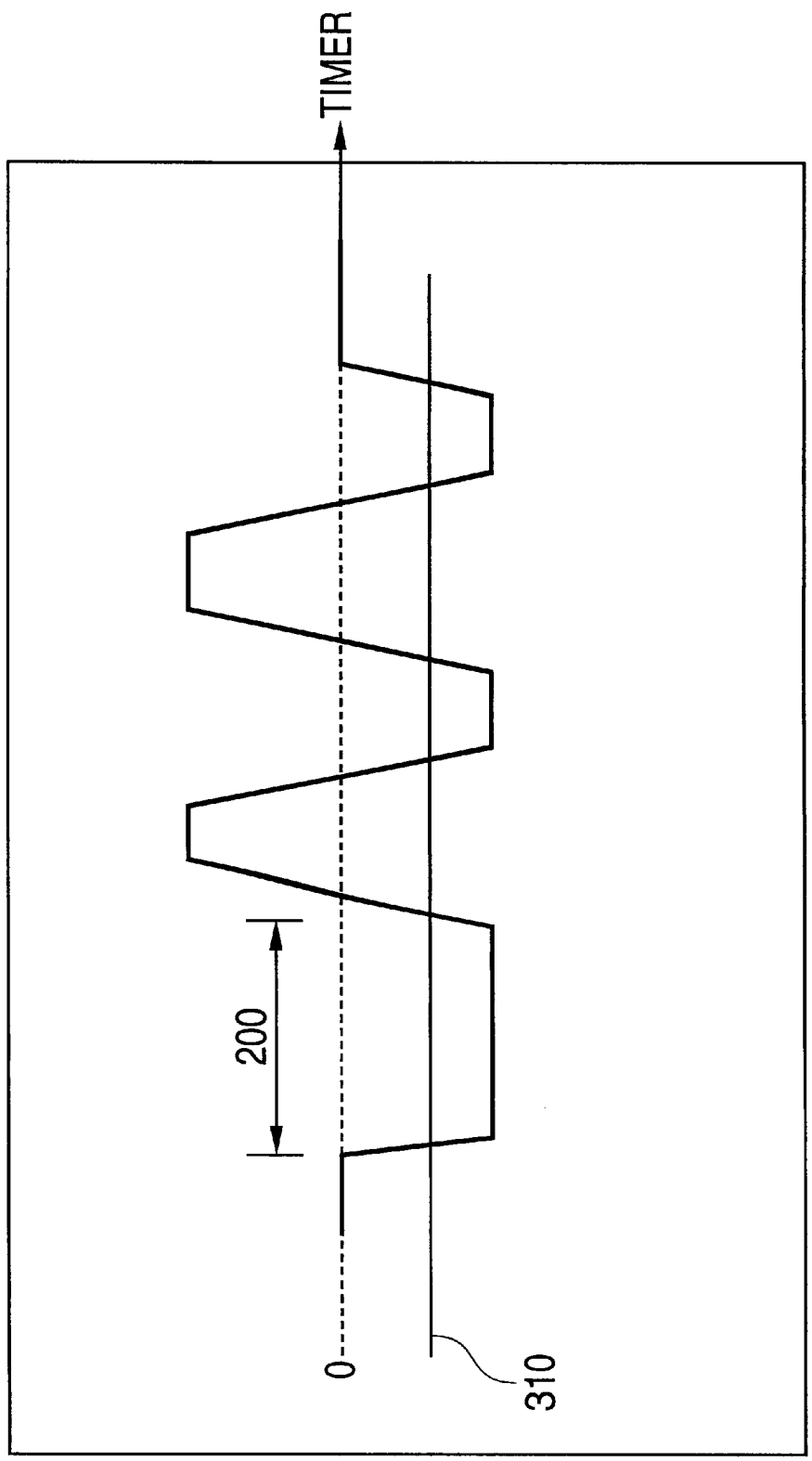
FIG. 2 is a waveform diagram of a DQS signal.

FIG. 1 is a block diagram of an example of a memory controller 10 and its associated elements and FIG. 2 is a waveform diagram of a DQS signal. The memory controller 10 of FIG. 1 consists of a Core unit 100 and an I/O unit 140. The I/OI unit 140 is connected to a DDR unit 150 which is associated with the memory controller 10. The Core unit 100 consists of four flip-flops 101–104. The flip-flops 101 and 102 receive data signals oDQ inputted thereto while flip-flops 103 and 104 output signals idata therefrom. All four flip-flops 101–104 are clocked by clock signal Clk1 which, for exemplary purposes only, is assumed to be 100 MHz. Note that flip-flops 101 and 103 latch on the rising edge of the clock signal input thereto while flip-flops 102 and 104 latch on the falling edge of the clock signal input thereto. Accordingly, data is clocked in and out of core unit 100 on both leading and trailing edges of clock signal Clk1.

The outputs of flip-flops 101 and 102 are inputted to a multiplexer (MUX) 110 whose output feeds flip-flop 111, both of the multiplexer 110 and flip-flop 111 being part of the I/O unit 140. Flip-flop 112 receives the data strobe signal oDQS. Both flip-flops 111 and 112 are clocked by a clock signal Clk2 which, for exemplary purposes only, is assumed to be 200 MHz. The outputs of flip-flops 111 and 112 are respectively inputted to pre-drivers 120 and 121 whose outputs are respectively inputted to drivers 130 and 131. The pre-drivers and drivers provide sufficient output signals to drive transmitter/receiver pairs 161–162 and 163–164 of the DDR 150.

The clock signal Clk2 is also inputted to a frequency divider 125 whose output feeds a delay locked loop (DLL) 170 of the DDR 150. The division ratio of the frequency divider 125 is usually chosen such that the output frequency of the frequency divider 125 is equal to the frequency of the clock signal Clk1. That is, if the frequency of the clock signal Clk1 is equal to 100 MHz and the frequency of the clock signal Clk2 is equal to 200 MHz, then the division ratio of the frequency divider 125 may be set equal to ½.

The output of the DLL 170 is used to clock flip-flops 171 and 172 of the DDR 150. The inputs of flip-flops 171 and 172 are respectively connected to the data signal DQ and the strobe signal DQS. The outputs of the flip-flops 171 and 172 are respectively inputted to amplifiers 135 and 136. The output of amplifier 135 is fed to the data input of flip-flops 113 and 114 while the output of amplifier 136 is fed to the Strobe Parking & Delay circuit 127 whose output is fed to the clock signal inputs of flip-flops 113 and 114. The outputs of flip-flops 113 and 114 are respectively fed to the data inputs of flip-flops 103 and 104 of the Core unit 100.

The WRITE path for the DDR, as shown in FIG. 1, includes pre-drivers 120 and 121 and drivers 130 and 131 for both the DQ and DQS signals. The READ path for the DDR includes the Strobe Parking & Delay circuit 127 which will be used to detect a valid READ PREAMBLE of the DQS signal, the DQS signal being delayed prior to being used to latch the READ data.

A typical strobe waveform during a READ cycle is shown in FIG. 2. The READ PREAMBLE 200 may be set equal to (0.9–1.1)Tck, for example, wherein Tck is one clock period. For a 100 MHz clock, for example, the minimum READ PREAMBLE period would be equal to 9 ns. The minimum READ PREAMBLE period may be used in accordance with the DDR SDRAM manufacturers and JEDEC specifications for validating the READ PREAMBLE.

In the example embodiment of the present invention, if a 100 MHz clock is used as the basic clock frequency Clk1, then a 400 MHz clock, such as the clock used for Front Side signaling in the memory controller, may be used to sample the DQS signal. Both the rising and falling edges of the 400 MHz clock are used for sampling the DQS signal. Thus, during a READ cycle when the DQS signal is asserted LOW by the DDR SDRAM device, if the signal at the receiver is below a predetermined value 310, as illustrated in FIG. 2, for at least a minimum number of samples (e.g. 6 or 7 samples) as sampled by both edges of the 400 MHz clock, then a valid READ PREAMBLE is presumed to have been detected.

The subsequent edges of the DQS signal will then be used for latching the data at the receiver. Note that even in the example embodiment of the present invention, it is not necessary for the sample clock to be 400 MHz. Rather, the sample clock determines the measurement accuracy with respect to measuring the period of the READ PREAMBLE such that increasing the sample clock frequency improves the overall measurement accuracy. For example, if a 533 MHz sampling clock is used, then a valid READ PREAMBLE can be detected for the signal being below the predetermined minimum value for least 8 samples.

Figure 3:
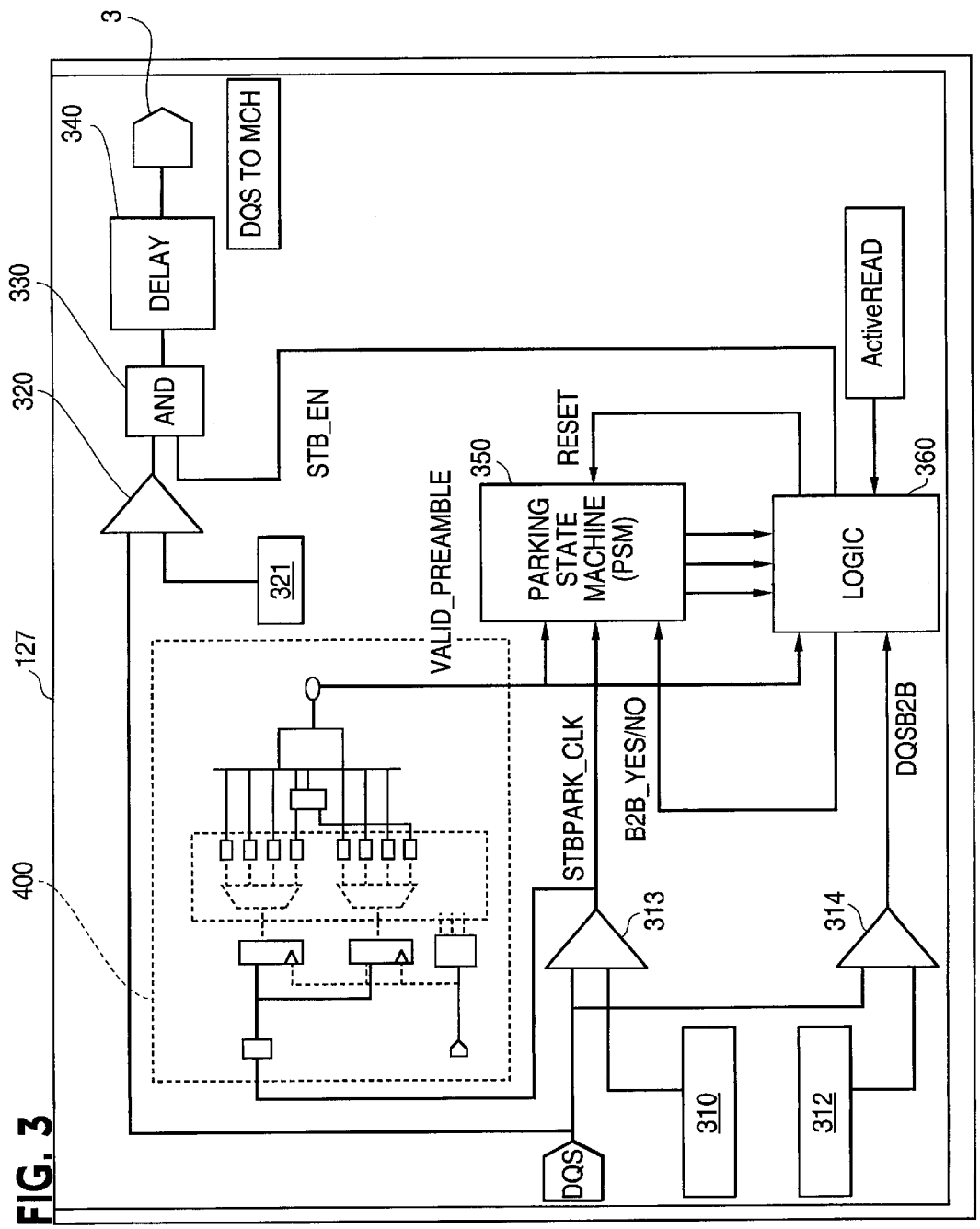
FIG. 3 is a block diagram of an example of the Strobe Parking & Delay circuit of the memory controller of FIG. 1.

FIG. 3 illustrates an example of the Strobe Parking & Delay circuit 127 of the memory controller 10 of FIG. 1. Included in FIG. 3 are comparators (or sense amplifiers) 313, 314, and 320. The DQS signal (outputted from amplifier 136 of FIG. 1) is inputted to one input of each of the comparators while the other inputs of each of the comparators are respectively connected to reference voltage sources 310, 312, and 321. The reference voltage source 310 would be set equal to the maximum LOW level while the reference voltage source 312 would be set equal to the minimum HIGH level. The third reference voltage source would be set equal to another predetermined value, for example, 1.25 volts as will be discussed later.

The output of comparator 313 is outputted to a Parking State Machine (PSM) 350, whose function will be discussed later, and to a READ PREAMBLE detector 400, shown in detail in FIG. 4. The output of comparator 314 is fed to a logic unit 360, whose function will be discussed later. The VALID_PREAMBLE# signal outputted from the detector 400 is inputted to the PSM 350 and the logic unit 360. The logic unit 316 also receives an Active READ signal informing it of a read operation. The logic unit 368 and the PSM 350 also communicate with each other. A signal STB_EN, outputted from the logic unit 360, is inputted to an AND gate 330 along with the output of comparator 320. The output of the AND gate 330 is delayed by a delay unit 340 for a delay period which may be on the order of 2 ns in the case of the example clock frequencies noted above. The signal 370 outputted from the delay unit 340 is used as the clock signal for flip-flops 113 and 114 of the I/O unit 140 of FIG. 1.

Figure 4:
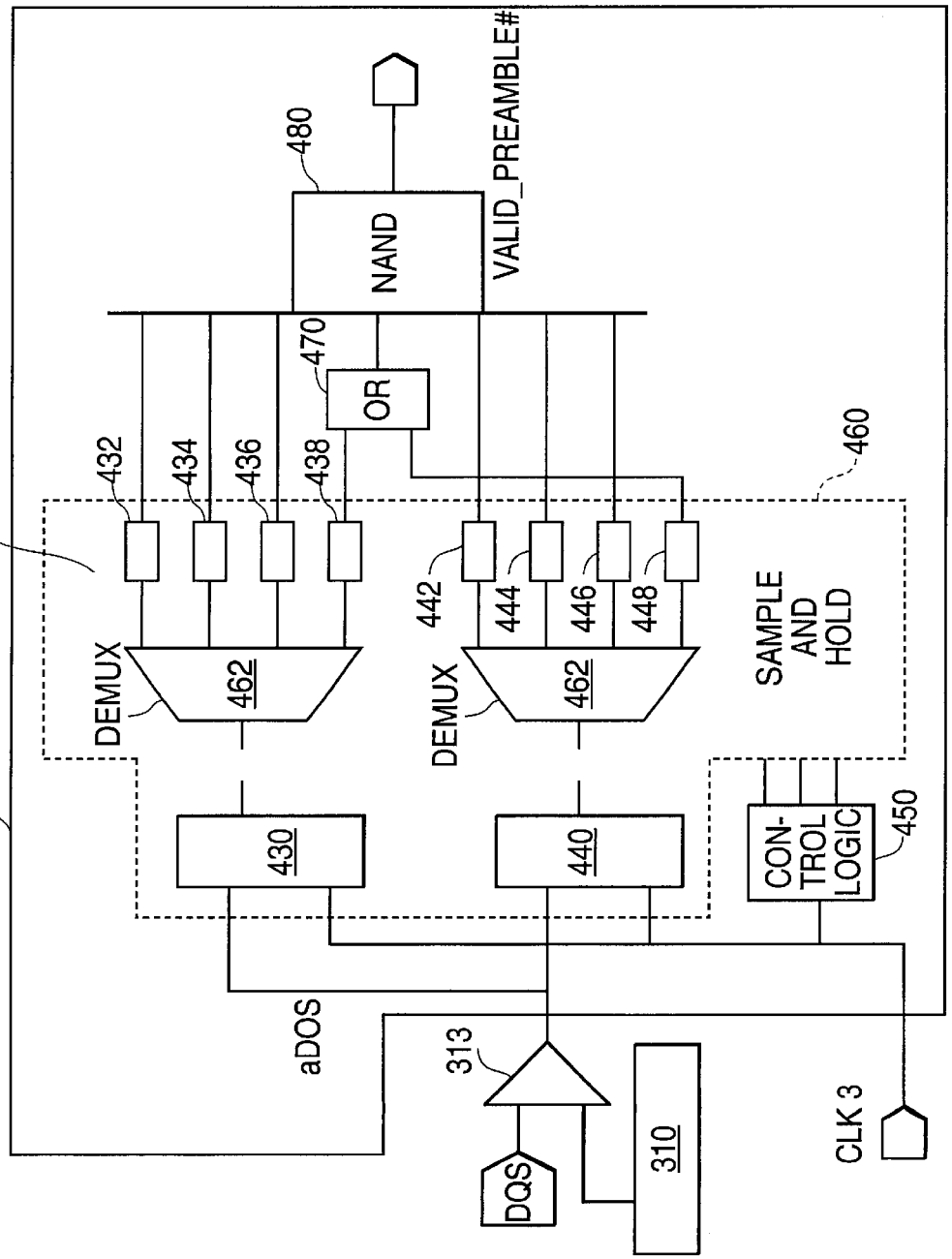
FIG. 4 is a block diagram of an example of the READ PREAMBLE detector of the Strobe Parking & delay circuit of FIG. 3.

FIG. 4 is a block diagram of an example of the READ PREAMBLE detector 400 of the Strobe Parking & delay circuit 127 of FIG. 3. As noted previously, the strobe signal DQS is compared with a reference voltage from reference voltage source 310 in comparator (or sense amplifier) 313, whose output feeds the data inputs of flip-flops 430 and 440. As with flip-flops 101 and 102 of FIG. 1, flip-flops 430 and 440 respectively latch on the rising and falling edges of the clock signal input thereto. In this case, the clock input is clock signal Clk3. The frequency of the clock signal Clk3 is normally chosen to be higher than the frequency of clock signal Clk1, for example, if the clock signal Clk1 is of a frequency of 100 MHz, then the frequency of the clock signal Clk3 may be chosen to be 400 MHz.

Flip-flops 430 and 440 are part of a sample and hold unit 460. As shown in FIG. 4, the output of flip-flop 430 is fed to a first demultiplexer 461 while the output of flip-flop 440 is fed to a second demultiplexer 462. The outputs of the demultiplexers 461 and 462 are fed to latches 432, 434, 436, 438, 442, 444, 446, and 448. The latches are all clocked by signals (not shown) from the control logic 450 which generates the signals from the clock signal Clk3 inputted thereto. The outputs of latches 432, 434, 436, 442, 444, and 446 are fed to inputs of NAND gate 480 while the outputs of latches 438 and 448 are inputted to an OR gate 470 whose output is also inputted to an input of NAND gate 480. Note that the sample and hold unit 460 has been shown as consisting of multiple demultiplexers and latches. However, it is of course understood that the elements used to implement the sample and hold unit 460 are not limited to those illustrated in FIG. 4. For example, a shift register may be used to constitute the sample and hold unit 460. Furthermore, logic elements other than NAND gate 480 and OR gate 470 may be used to perform the same function.

In any event, as presently illustrated in FIG. 4, the READ PREAMBLE detector 400 stores 8 samples of the strobe signal aDQS, which is merely a thresholded version of the strobe signal DQS. Note that the output of the NAND gate 480 is a logic LOW level only if the outputs of latches 432, 434, 436, 442, 444, and 446 are at a logic HIGH level and at least one of the outputs of latches 438 and 448 are at a logic HIGH level. Thus, the READ PREAMBLE detector 400 produces and output only when the DQS strobe signal is at a logic LOW level for seven or eight consecutive samples. The number of samples is not limited to 8 but rather, the number of samples is determined by the frequency of the clock signal Clk3 and the desired threshold criterion for the minimum time period that the strobe signal is at a logic LOW level. Using a higher frequency clock signal allows for improved accuracy but increases the number of samples which must be held by the sample and hold unit 460.

Referring back to FIG. 3, the READ PREAMBLE detector 400 outputs a VALID_PREAMBLE# signal to the PSM 350 and the logic unit 360, indicating the detection of a valid PREAMBLE. The DQS signal is essentially thresholded by the comparator 320 to insure that noise will not cause an erroneous strobe signal. The reference voltage source 321 would therefore be set at a low level, such as 1.25 volts, for example. The output of the comparator 320 is inputted to the AND gate 330 along with a strobe enable signal STB_EN from the logic unit 360. The PSM 350, together with the logic unit 360, receive the VALID_PREAMBLE# signal, the STBPARK_CLK signal, and the DQSB2B signal respectively outputted from the READ PREAMBLE detector 400, comparator 313, and the comparator 314. In addition, the logic unit 360 receives an Active READ signal from the Core unit 100 so as to generate the strobe enable signal STB_EN inputted to the AND gate 330. The output of the AND gate 330 is inputted to a delay unit 340. The time delay of the delay unit 340 is selected so as to insure that the DQS strobe signal is strobing the data DQ at the most suitable point in time, that is, in the middle of a read data window. With the example values of the three clock signals noted above, a time delay of two nanoseconds might be suitable.

The PSM 350 and logic unit 360 together keep track of the number of data bursts and determine by that number when to disable the strobe enable signal STB_EN, for example, when all of the data has been strobed in. Furthermore, by keeping track of the number of data bursts, they are able to determine a back-to-back READ occurrence so as to keep the strobe enable signal STB_EN properly enabled in the case of back-to-back READ occurrences so as to allow all of the data to be strobed in.

This concludes the description of the example embodiment. Although the present invention has been described with reference to an illustrative embodiment, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings, and the appended claims without departing from the spirit of the invention. In addition to variations and modifications in the component parts and/or arrangements, alternative uses will also be apparent to those skilled the art.

For example, as previously noted, the present invention is not limited to the detection of a data strobe signal for a DDR SDRAM but rather may be utilized to detect a valid data strobe signal used in any application.

What is claimed is:

1. An apparatus for detecting a valid data strobe contained within a strobe signal, the apparatus comprising:

a voltage detector to detect whether a measured voltage level of the strobe signal is above or below a preselected threshold level and to provide an output in response thereto;

a sample and hold unit coupled to the voltage detector to sample and hold the strobe signal detected by the voltage detector;

a sampling clock unit coupled to the sample and hold unit to generate a sampling clock signal, wherein the sampling clock signal sets a sampling frequency of the strobe signal for the sample and hold unit, wherein the sampling frequency determines a measurement accuracy of the strobe signal, and wherein the strobe signal is sampled by the sample and hold unit at a time that corresponds to either a rising edge or a falling edge of the sampling clock signal; and a valid strobe detector coupled to the sample and hold unit to detect a valid strobe signal upon receiving a predetermined number of consecutive valid strobe signal samples from the sample and hold unit, wherein the consecutive strobe signal samples are taken at a time that corresponds to either a rising edge or a falling edge of the sampling clock signal.

2. The apparatus of claim 1, wherein the voltage detector comprises a comparator to compare the measured voltage level of the strobe signal with a predetermined reference voltage bearing relationship to the preselected threshold level.

3. The apparatus of claim 1, wherein the sample and hold unit comprises a demultiplexer having a plurality of outputs, each of the plurality of outputs being connected to a respective latch.

4. The apparatus of claim 1, wherein the sample and hold unit comprises a shift register.

5. The apparatus of claim 1, further comprising an output unit to output the valid data strobe signal upon the valid strobe being detected by the valid strobe detector.

6. The apparatus of claim 5, the output unit comprising another voltage detector to detect whether a measured voltage level of the strobe signal is above or below another preselected threshold voltage and to provide an output in response thereto.

7. The apparatus of claim 5, the output unit further comprising a delay unit to output the valid data strobe signal which is been delayed by a predetermined time period.

8. A method of outputting a valid data strobe contained within a strobe signal, the method comprising:

determining whether samples of the strobe signal are at a first or second logic level and providing an output in response thereto by periodically sampling the strobe signal and comparing the samples with a predetermined reference signal, wherein periodically sampling the strobe signal comprises setting a sampling frequency of the strobe signal by generating a sampling clock signal, wherein the sampling frequency of the strobe signal determines a measurement accuracy of the strobe signal, and wherein sampling of the strobe signal takes place at a time that corresponds to either a rising edge or a falling edge of the sampling clock signal;

determining the number of consecutive strobe signal samples for which the samples are at the second logic state;

detecting a valid data strobe upon reaching a predetermined number of consecutive strobe signal samples at the second logic state, wherein the consecutive strobe signal samples are taken at a time that corresponds to either a rising edge or a falling edge of the sampling clock signal; and outputting a valid data strobe upon the detection thereof.

9. An apparatus for detecting a valid data strobe contained within a strobe signal, the apparatus comprising:

a voltage detector to detect whether a measured voltage level of the strobe signal is above or below a preselected threshold level and to provide an output in response thereto;

a sample and hold unit coupled to the voltage detector to sample and hold the strobe signal detected by the voltage detector;

a sampling clock unit coupled to the sample and hold unit to generate a sampling clock signal, wherein the sampling clock signal sets a sampling frequency of the strobe signal for the sample and hold unit, wherein the sampling frequency determines a measurement accuracy of the strobe signal, and wherein the strobe signal is sampled by the sample and hold unit at a time that corresponds to either a rising edge or a falling edge of the sampling clock signal;

a valid strobe detector coupled to the sample and hold unit to detect a valid strobe signal upon receiving a predetermined number of consecutive valid strobe signal samples from the sample and hold unit, wherein the strobe signal samples are taken at a time that corresponds to either a rising edge or a falling edge of the sampling clock signal; and a time delay unit coupled to the valid strobe detector to determine strobing time window for the strobe signal;

wherein the output of the sample and hold unit comprises a plurality of outputs, and wherein the valid strobe detector comprises a NAND gate having inputs respectively connected to the plurality of outputs of the sample and hold unit.

* * * * *